United States Patent
Shikata et al.

(10) Patent No.: US 6,255,376 B1
(45) Date of Patent: Jul. 3, 2001

(54) THERMALLY CONDUCTIVE COMPOUND AND SEMICONDUCTOR DEVICE USING THE SAME

(75) Inventors: Kunihide Shikata; Toshihiko Maeda, both of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/123,756

(22) Filed: Jul. 27, 1998

(30) Foreign Application Priority Data

Jul. 28, 1997 (JP) .................................................. 9-201654

(51) Int. Cl.$^7$ ...................................................... C08K 3/38
(52) U.S. Cl. ........................... 524/404; 524/430; 524/440
(58) Field of Search .................... 524/404, 430, 524/440

(56) References Cited

U.S. PATENT DOCUMENTS

| | | |
|---|---|---|
| 5,094,769 | 3/1992 | Anderson, Jr. et al. . |
| 5,180,761 * | 1/1993 | Shiao .................................. 523/213 |
| 5,252,655 * | 10/1993 | Parker ................................. 524/430 |
| 5,391,604 | 2/1995 | Dietz et al. . |
| 5,530,047 * | 6/1996 | Watanabe ............................ 524/405 |
| 5,552,210 * | 9/1996 | Horn .................................... 428/209 |

FOREIGN PATENT DOCUMENTS

| | | |
|---|---|---|
| 61-029162 | 2/1986 | (JP) . |
| 61-036961 | 2/1986 | (JP) . |
| 6095557 | 11/1994 | (JP) . |

OTHER PUBLICATIONS

Lacombe, R. H. And H. Lee, "Flexible Heat–Conducting Sheet Material for Semiconductor Packages," IBM Technical Disclosure Bulletin, vol. 25, No. 11A, Apr. 1983; pp. 5740–5743.

* cited by examiner

Primary Examiner—Paul R. Michl
(74) Attorney, Agent, or Firm—Hogan & Hartson, LLP

(57) ABSTRACT

A thermally conductive compound which comprises 15 to 60 volume % of thermoplastic carrier resin consisting of a copolymer of a plasticizer with ethylene or of a polymer of the plasticizer, polyethylene and the copolymer, 40 to 85 volume % of thermally conductive filler particles dispersed in the carrier resin, and 0.5 to 5 weight % (for the filler particles) of a dispersing agent having (a) hydrophilic group (s) and (a) hydrophobic group(s). The thermally conductive compound has a high thermal conductivity and a plasticity in the range of temperatures of −40 to 50° C., and when it is interposed between an insulator body and a semiconductor element mounted thereon or between the semiconductor element and a cap, the heat generated by an operation of the semiconductor element is rapidly transferred and the thermal stress caused by the difference of coefficients of thermal expansion between the semiconductor element and the insulator body or cap is absorbed and relieved to cause no phase separation between them. The semiconductor device using the thermal compound, accordingly, is highly reliable.

4 Claims, 1 Drawing Sheet

THERMALLY CONDUCTIVE COMPOUND AND SEMICONDUCTOR DEVICE USING THE SAME

BACKGROUND OF THE INVENTION

1. Field of the Invention

The present invention relates to a thermally conductive compound which is suitable as heat transfer means which rapidly acts to transfer heat generated by the operation of a semiconductor integrated circuit element to a radiation part as well as a semiconductor device using the same.

2. Description of the Related Art

A semiconductor element, for example, semiconductor integrated circuit element, is tightly sealed up, for example, in a semiconductor element housing package to avoid contact with the air when used, and the resulting semiconductor device is connected electrically and mechanically to an outer electric circuit to use.

The semiconductor element housing package generally consists of an insulator body, in which a conductor wiring is formed in a prescribed pattern and on the surface of which a portion for mounting a semiconductor integrated circuit element (element mounting portion) is provided, and a cap which covers the element mounting portion and forms a hollow cut off from the outside between the body and a circumference provided at the part surrounding the element mounting portion on the upper surface of the body. The semiconductor integrated circuit element is then placed in the element mounting portion of the semiconductor element housing package, and then the cap is closely placed on a substrate surrounding the element mounting portion and adhered thereto with a heat curing resin, etc., to form a cell consisting of the insulator body and the cap. The semiconductor integrated circuit element is placed inside the tightly sealed hollow of the cell to make a semiconductor device.

In recent years, high integration of semiconductor integrated circuit elements considerably increases and there is a tendency to increase markedly the heating value during the operation of the semiconductor element, so it becomes an important problem to rapidly release heat generated by the semiconductor integrated circuits outside of the semiconductor device in order to prevent abnormal operation of the element arising from overheating.

In order to avoid this problem, a thermally conductive compound having high thermal conductivity is inserted between the upper surface of a semiconductor integrated circuit and the cap in the airtight sealed-up portion to make a practical structure, and a highly heat conductive material such as copper or aluminum is used as the cap material, or as an alternative method, a material for heat dissipation such as a radiation fin on the upper surface of the cap is provided so that heat generated by the semiconductor integrated circuit element is rapidly transferred to the cap, from which the heat was rapidly released outside.

When a cap made of copper or aluminum is used, however, a shearing stress is repeatedly added to the thermally conductive compound inserted between the semiconductor integrated circuit element and the cap of which the expansion/shrinkage rate is different, by the repeated rise and drop in temperature accompanied by the repeated work and rest of the semiconductor integrated circuit element, because the thermal expansion rate is greatly different between the cap and the semiconductor integrated circuit element mainly made of a silicon material (linear thermal expansion rate at 40° C. is $1.678 \times 10^{-5}$/deg for copper, $2.313 \times 10^{-5}$/deg for aluminum, and $2.4 \times 10^{-6}$/deg for silicon) and in addition the thermally conductive compound is used in a state closely adhesive and chemically or physically linked to the cap and the semiconductor integrated circuit element in order to enhance the thermal conductivity at the surfaces of the thermally conductive compound with the cap and with the semiconductor integrated circuit element. As a result, it is afraid that the thermally conductive compound might be destroyed or the semiconductor integrated circuit might be destroyed by a reaction, or cracks or peeling-off might be produced at the surface of the thermally conductive compound with the circuit element or cap. Accordingly, a variety of thermally conductive compounds and semiconductor devices have been proposed because the merely high thermal conductivity is insufficient.

For example, Japanese Unexamined Patent Publication JP-A 61-29162 (1986) has proposed a semiconductor device that keeps in contact with a thermally conductive material, in which at least one of the upper surface of a pellet (semiconductor integrated circuit element) and the back surface of a cap or the back surface of the pellet and the upper surface of the substrate, to which the pellet is fixed, comprises silicon gel interposed between them, or silicon gel containing a filler consisting of alumina or silicon carbide. According to this device, by making a thermally conductive material comprising silicon gel interposed between the upper surface of the pellet and the backside of the cap, heat generated in the pellet can be released to the cap to effectively prevent overheat of the pellet. Moreover, since the silicon gel has elasticity, mechanical destruction such as occurrence of cracks on the pellet by temperature change can be avoided. Further it is also possible to release the heat more effectively by adding a filler comprising alumina or silicon carbide as a thermally conductive material with high thermal conductivity.

In addition, Japanese Unexamined Patent Publication JP-A 61-36961 (1986) proposes a multi-chip integrated circuit package which comprises a circuit substrate, a plural number of integrated circuit chips (semiconductor element) which are connected electrically or mechanically to the circuit substrate through a plural number of flexible leads provided in advance on the body, a plural number of heat radiating plate fixed to a plural number of integrated circuit chips in one-to-one correspondence through the first thermally conductive adhesive, a heat radiation cover which covers the chip-mounted surface and is fixed to a plural number of heat radiating plates through the second thermally conductive adhesive, and a heat sink fixed on the heat radiation cover. As for the thermally conductive adhesives, an epoxy adhesive containing a highly thermally conductive silver-filler and tin-lead eutectic solder are disclosed. According to this multi-chip integrated circuit package, heat generated by the integrated circuit chips is effectively transferred to the heat sink to effectively cool the chips, and the improvement of radiation characteristics can be attained.

In addition, Japanese Examined Patent Publication JP-B2 6-95557 (1994) has proposed a thermally conductive compound which comprises a liquid carrier selected from the group consisting of mineral oils and poly(α-olefin) oil, thermally conductive filler particles which are dispersed in the liquid carrier so as to wet the particle surface, and a binder which has at least one functional group reacting with the surface of the thermally conductive filler particles and at least one functional group having the same polarity as the liquid carrier, the binder being selected from the group consisting of organosilanes, organotitanates, organoaluminates and organozirconates. According to the patent publication, the thermally conductive compound is a phase-stable and thermally conductive compound that contains a coupling agent (binder) selected from the group consisting of organometals which has at least a dielectric liquid carrier, highly thermally conductive fillers (used for filling) homogeneously dispersed in the carrier, and a functional group reacting with the particle surface and another functional group preferentially moistening the particles by self-coagulation. The compound is adaptable to any chip surface of which the roughness, slope and height are different, is able to moisten the surface, exhibits high filling density, maximizes the thermal conductivity, and maintains a homogeneous suspension to prevent phase separation. As a result, a thermally conductive compound that hardly causes phase separation, though the viscosity is low, sparingly flows out, and is suitable for the application to integrated circuit chips, can be provided.

Moreover, a treatise by Lacombe et al., "FLEXIBLE HEAT-CONDUCTING SHEET MATERIAL FOR SEMICONDUCTOR PACKAGES" published in IBM Technical Disclosure Bulletin, April 1983, vol. 25, no. 11A, 5740–5743, has proposed a thermally conductive compound which is prepared by filling ceramic particles consisting of boron nitride of 1–15 $\mu$m in diameter into a polymer carrier consisting of polyisobutylene. The compound, according to the disclosure, is subjected to a step of being placed as a flexible sheet material on the chip mounted on the multi-layer ceramic substrate, or is laminated as sheets in the inside of an aluminum cap to use as means for transferring heat from a chip to a cap. According to the disclosure, when the molecular weight of polyisobutylene is made higher than 100,000, the content of chemically inactive boron nitride particles with high thermal conductivity and low electric conductivity in the polymer carrier can be made 90 weight % or higher. Since polyisobutylene which is a viscoelastic liquid becomes rubbery at room temperature at the high molecule, the cap can be disposed by making the thermally conductive material mediate in one step as mentioned above, and labor saving can be attained much more than in the usual grease-supply method.

The respective prior arts as mentioned above, however, had the following problems.

The semiconductor device as proposed in JP-A 61-29162 (1986) has such a problem that the silicon gel as a thermally conductive material, which usually has a low thermal conductivity of approximately 0.2–0.3 W/mK, insufficiently transfers heat to probably overheat the semiconductor integrated circuit elements when used as heat transfer means for the current semiconductor integrated circuit elements of which the calorific value strikingly increases. Moreover, it was also problem that since the viscosity of silicon gel is high, when the filler is intended to charge at a high rate, there is formed cracks in the filler because of insufficient distribution of the silicon gel so that the thermal conductivity of the thermal conductive material cannot be increased sufficiently.

On the other hand, in the integrated circuit package proposed in Japanese Unexamined Patent Publication JP-A 61-36961 (1986), it was problem that since the integrated circuit chip and the radiation plate are adhered with a thermally conductive adhesive, when the coefficient of thermal expansion is considerably different between both materials, mechanical stress due to the temperature difference of both materials is exerted on the integrated circuit chips possibly causing destruction, so the coefficient of thermal expansion of the radiation plate is required to be equal to that of the integrated circuit chips, the choices of the material of radiation plate is limited, and the radiation plate cannot be produced with a material having high thermal conductivity.

In Japanese Unexamined Patent Publication no. 61-36961, an example of a TAB type of integrated circuit chips which have a plural number of lead wires of tape type is shown, wherein bending formation is applied to the circuit chip and then the chip is lead-bonded on the substrate, so that no cut of the lead wire occur by vertical or horizontal movement of the chip body, and accordingly, as described, the quality of the radiation cover material can be determined in primary consideration of the thermal conductivity but disregarding the coefficient of thermal expansion. It was a problem, however, that when a method for chip disposition other than the TAB method is employed, for example, when the chip is mounted on the substrate through a solder layer by a flip-chip mounting, the use of this radiation structure causes destruction of the solder layer with vertical or horizontal movement of the chip body and the connection of the integrated circuit with the substrate cannot be maintained.

On the other hand, the thermally conductive compounds proposed in Japanese Examined Patent Publication JP-B2 6-95557 (1994) are grease-like thermally conductive compounds prepared by dispersing thermally conductive filler particles in an organic liquid as a carrier, and when the compounds are used as thermally conductive materials in a semiconductor device, moisture contained in an airtight sealed-up cavity sometimes acts on the binder contained in the thermally conductive compounds to join together; as a result, there is a fear that the capacity of the thermally conductive filler particles becomes insufficient and cause phase separation between the organic liquid as carrier and the thermally conductive filler particles. As a result of the phase separation, the organic liquid flows out to cause shortage of amount and to form cavities of flowing-out, which disturb heat transfer or produce aggregate of the thermally conductive filler particles making the heat transfer uneven in the thermally conductive compounds or causing decrease of mechanical strength of the thermally conductive filler particles such as falling-off of the thermally conductive filler particles.

In the thermally conductive compounds proposed in a report of IBM Technical Disclosure Bulletin, the polyisobutylene as a polymer carrier, when the heat cycle test (the reliability test for confirmation whether there is no trouble in a semiconductor device in the appearance or specific quality which might be produced by the repetitive temperature change caused by environment where the device is used or by generation of heat from the semiconductor integrated circuit element, usually repeated 50–1000 cycles at a certain cycle at lower temperatures of −50 to −40° C. and at higher temperatures of +125 to 150° C.) which is required to assure the reliability of a semiconductor device is applied thereto, loses the plasticity at lower temperatures to become hard, so it was a problem that the thermally conductive compounds cannot relieve thermal stress generated by the difference of coefficients of thermal expansion between the chip and the cap to cause destruction inside of the thermally conductive compound or around the contacting surface of the chip of the thermally conductive compound or to peel off from the cap surface because the compound cannot stick thereto consecutively.

SUMMARY OF THE INVENTION

The invention was devised in view of the aforementioned situation and an object of the invention is to provide a highly reliable thermally conductive compound which per se exhibits high thermal conductivity, is adhesive well to semiconductor integrated circuit elements or surfaces of caps, rapidly transfer heat from the elements or to the caps, absorbs and relieves the thermal stress generated by difference of the thermal expansion coefficient between the element and the cap, and causes no phase separation.

The invention is also aimed to provide a highly reliable semiconductor device using the thermally conductive compound, which can rapidly release heat generated by the semiconductor integrated circuit elements outside the device.

The invention provides a thermally conductive compound comprising:

15 to 60 volume % of thermoplastic carrier resin comprising a copolymer of at least one plasticizer selected from vinyl acetate, acrylic acid esters and methacrylic acid esters, with ethylene; or a polymer of the at least one plasticizer, polyethylene and the copolymer; and 40 to 85 volume % of thermally conductive filler particles comprising at least one selected from aluminum nitride, boron nitride, aluminum oxide, aluminum, silver, copper and diamond, the thermally conductive filler particles being dispersed in the carrier resin, which particles contain as an additional additive a dispersing agent comprising at least one of glycerin fatty acid esters or their polymers, organic silanes having (a) hydrophilic group(s) and (a) hydrophobic group (s) or organic titanates having (a) hydrophilic group(s) and (a) hydrophobic group(s) at a rate of 0.5 to 5 weight % for the filler particles.

Since the thermally conductive compound according to the invention is a thermally plastic resin comprising a copolymer of the plasticizer with ethylene or a polymer of the plasticizer and polyethylene and the copolymer as a carrier resin, the ethylene polymer portion (ethylene polymer portion of the copolymer of ethylene with the plasticizer and polyethylene) constituting the carrier resin is in a state in which the filler particles are contacting each other and maintains the strength sufficient to keep a fixed form of the resin so that the carrier resin does not flow out due to gravity.

Since the thermally conductive compound according to the invention is a thermoplastic resin comprising a copolymer of the plasticizer with ethylene or a polymer of the plasticizer and polyethylene and the copolymer as a carrier resin, the thermally conductive compound have a sufficient plasticity mediated by the action of the plasticizer which affords a plasticity to resins even at a temperature of −40 to 50° C. at which plasticity is poor in the case of polyethylene alone, and can easily deform with external force such as pressure which is added for the purpose of making tightly adhere to a material such as an element and a cap through which the heat from the thermally conductive compound is given and taken, or thermal stress generated by the difference of coefficients of thermal expansion between parts such as an element and a cap.

As shown above, since the carrier resin has a sufficient plasticity, when the thermally conductive compound is used as heat transfer means between elements and caps in a semiconductor device, the compound can easily be deformed at a temperature of around 20° C. at which the elements are not working, and so the compound can be tightly adhered to the surfaces of the elements or caps according to the respective fine unevenness. Tight adhesion of the thermally conductive compound on the element and cap makes it possible to rapidly transfer heat generated by working of the element from the element to the compound, and then from the compound to the cap.

In addition, since the carrier resin has a sufficient plasticity and the plasticity is not lost even after repetition of a heat cycle test at a low temperature because the resin has the plasticity even at a low temperature of around −40 to 50° C., the thermal stress which is generated by the difference in coefficients of thermal expansion of the element and the cap can be absorbed and relieved by deformation of the thermally conductive compound to prevent destruction of the compound or element or occurrence of cracks or peeling-off on the interface between the compound and the element or cap maintaining the tight adhesion of the compound to the element and cap.

In addition, since the thermally conductive compound according to the invention is such a thermoplastic resin as the plasticity is increased by the generation of heat in the element, it is advantageous that, when the heat is generated with working of the element, the plasticity of the carrier resin is increased to promote absorption and relief of the thermal stress and an adhesive property of the thermally conductive compound is increased to enhance the tight adhesion to the element and cap.

In addition, since the thermally conductive compound according to the invention is hydrophobic at the ethylene polymer portion constituting the carrier resin, the compound works to prevent moisture from entering into the carrier resin or being adsorbed on the surface of the resin. Accordingly, when the thermally conductive compound is used as heat transfer means between the element and the cap in a semiconductor device, the compound effectively prevent corrosion of the surface of the element or cap arising from contact with the moisture to reach the surface passing through the compound.

When the thermally conductive compound is used as heat transfer means between the element and the cap in a semiconductor device, the following process is usually employed: the compound may be formed in a sheet of the same thickness as or slightly thicker than the width of the space between the upper surface of the element and the bottom surface of the cap, which width is usually fixed in approximately 50–500 $\mu$m, the sheet is cut into an appropriate size and placed on the element mounted on the body, and the cap and body are fitly pressed so that the upper surface of the element and the bottom surface of the cap tightly adhere to the thermally conductive compound and the cap adheres to the body with a thermosetting resin, etc.

The thermally conductive compound, accordingly, when formed into a sheet less than hundreds of microns in thickness, is desired to have such a mechanical strength that the sheet is not easily broken by handling, e.g., during conveyance or work for mounting on the element.

In addition, the thermally conductive compound is also desired to have such a plasticity as to absorb and relieve the pressure which is accompanied by the pressure exerted for tightly adhering the upper surface of the element and the bottom surface of the cap to the thermally conductive compound, so that the element would not be destroyed by the pressure.

In addition, when an element is fitted up to the body by a flip-chip mounting method through a solder layer, the thermally conductive compound is also desired to have such a plasticity as to absorb and relieve the pressure so that the solder layer and its adhesive portion are not destroyed by the pressure.

In the thermally conductive compound of the invention, it is necessary to set the composition rates of the carrier resin and of the filler particles in a range of 15–60 volume % for the resin (40–85 volume % for the particles).

When the rate of the carrier resin in the thermally conductive compound is lower than 15 volume % (the filler particles over 85 volume %), it becomes difficult to link together and maintain the filler particles which are in contact with each other forming a thermally conductive route because the amount of the carrier resin is insufficient for that of the filler particles, and so it becomes a problem that part of the filler particles are not involved in linkage and mechanical strength of the thermally conductive compound in a form of sheet decreases, and further it becomes difficult to make the surface of the thermally conductive compound smooth because the part of the filler particles protrude from the surface of the thermally conductive compound due to lack of the carrier resin.

On the other hand, when the rate of the carrier resin in the thermally conductive compound is higher than 60 volume % (the filler particles lower than 40 volume %), the amount of the carrier resin becomes larger than that of the filler particles and, consequently, the carrier resin intrudes into the filler particles to prevent direct contact between the particles. As a result, it might be difficult to make the thermal conductivity of the compound higher than 1 W/m K.

Moreover, it is appropriate to make the composition of the carrier resin at 20–60 weight %, more preferably at 30–50 weight %. When the plasticizer is higher than 20 weight %, the carrier resin has an enough plasticity, and when used as heat transfer means between an element and a cap in a semiconductor device, the pressure to be exerted for tight adhesion of the thermally conductive compound to the element and cap may be decreased to reduce possibility of destruction of the element. When the plasticizer is higher than 30 weight %, the plasticity of the carrier resin is further enhanced and the pressure to be exerted can be further reduced, and even in the case where the element is fitted to the body in a flip-chip mounting way, the solder layer used for mounting and its connective portion are not destroyed.

On the other hand, in the case where the plasticizer is lower than 60 weight %, it is possible to secure such a degree of mechanical strength that the thermally conductive compound may be used in a desired form of sheet. When the content is lower than 50 weight %, still the mechanical strength can be kept at such a degree that the thermally conductive compound formed in a sheet can not be easily broken by handling.

In addition, in the case where the content of the plasticizer is fixed in a preferred range of 20–60 weight % in the component of the carrier resin, the carrier resin is not generally decomposed thermally even under heating around 250–260° C. Accordingly, even in the case where the thermally conductive compound prepared with the carrier resin is used as heat transfer means between an element and an insulator body or cap in a semiconductor device and the device has to be heated up to about 200–250° C. in a reflow oven in installing the semiconductor device in an external circuit with a solder, in order to fuse the solder, the carrier resin is not thermally decomposed to effectively keep the function as heat transfer means.

Incidentally, it is considered that the action of plasticizer which affords plasticity to a carrier resin is based on the fact that a copolymer of the plasticizer with ethylene possesses a random structure in which the plasticizer and ethylene are copolymerized at random, and the polymer of plasticizer comes into polyethylene or the copolymer to make crystalline property of the resin decrease.

The plasticizers used for the thermally conductive compound of the invention, i.e., vinyl acetate, acrylic acid ester, and methacrylic acid ester, all have a carbon-carbon double bond and additionally a carbonyl group (—CO—) adjacent to the double bond, which decreases the crystalline property of the resin, and they form polymer or copolymers with ethylene to afford plasticity to the carrier resin suitable to the use.

Moreover, the thermally conductive compound according to the invention contains at least one of dispersing agents consisting of glycerin fatty acid ester, glycerin fatty acid ester polymer, organosilanes having hydrophilic and hydrophobic groups, and organotitanates having hydrophilic and hydrophobic groups as an additional additive to a mixture of the carrier resin and the filler particles at a rate of 0.5–5 weight % to the particles. Since all of these dispersing agents have (a) hydrophilic group(s) and (a) hydrophobic group(s), the hydrophilic group is bound to the surface of the filler particles through a secondary bonding such as hydrogen bond, and the hydrophobic group has an affinity to the hydrophobic carrier resin to bind the resin.

In preparing the thermally conductive compound, accordingly, the filler particles at a rate of 40–85 volume % as a final content in the thermally conductive compound are added to the liquidized carrier resin fused under heating or dissolved in an organic solvent together with a dispersing agent; the filler particles are homogeneously dispersed with the aforementioned action of the dispersing agent, and the resulting suspension is cooled or dried to solidify yielding the thermally conductive compound in which the filler particles are dispersed homogeneously in the solid carrier resin and kept in the resin in a state being directly in contact with each other to form a heat conductive route.

The amount of the dispersing agent to be added, when it is lower than 0.5 weight % to the filler particles, is in-sufficient for homogeneously dispersing all of the filler particles into the carrier resin, and the filler particles which have not reacted with the dispersing agent are aggregated and unevenly distributed in the thermally conductive compound; as a result, the thermal conductivity of the thermally conductive compound becomes uneven and, at the portion at which the filler particles are unevenly distributed, the mechanical strength is decreased due to lack of the carrier resin.

On the other hand, even though the dispersing agent was added at a rate of higher than 5 weight % to the filler particles, the dispersing effect of the filler particles could not be improved and rather the semiconductor device might receive a bad influence from the excess amount of the dispersing agent further added; particularly, in the case of the thermally conductive compound in which the mixing rate of the filler particles is high, there is a tendency to have a bad influence more often because a much more amount of the dispersing agent have to be added. Namely, for example, the heat generated during heating treatment when a cap is adhered to the body with a heat curing resin or when a semiconductor device is installed in an outside circuit body by soldering, makes a part of the dispersing agent in the thermally conductive compound distill off to afford plasticity to the heat curing resin which makes the cap adhere to the body and decrease the adhesion between the cap and the body.

The amount of the dispersing agent to be added, accordingly, is necessarily in a range of 0.5–5 weight %.

As for the dispersing agent for thermally conductive compound of the invention, including glycerin fatty acid esters or their polymers, organosilanes, and organotitanates, the followings may be used. These are advantageous in readily binding to the filler particles and dispersing the filler particles well into the carrier resin because of their high affinity to the carrier resin.

The glycerin fatty acid esters or their polymers to be used can be represented by the formula:

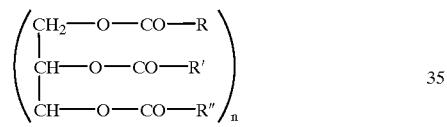

[wherein R, R' and R" are saturated or unsaturated acyclic hydrocarbon group having 1 to 22 carbon atoms; n<50] which are formed into a liquid by thermal fusion or by dissolving in an organic solvent and added to a carrier resin, wherein the liquid has such a fluidity that agitation of the liquid affords a homogeneous suspension at a temperature lower than 20–30° C.

Incidentally, R, R' and R" may be the same hydrocarbon group.

As for the organosilanes having both of a hydrophilic group and a hydrophobic group, those derived from silane ($SiH_4$) in which the hydrogen (H) is replaced by a hydrophilic group and a hydrophobic group may be used, for example, vinyltri-ethoxysilane, vinyl tris(β-methoxyethoxy) silane, β-(3,4-epoxycyclohexyl)ethyl trimethoxysilane, γ-glycidoxypropyl trimethoxysilane, γ-methacryloxypropyl trimethoxysilane, N-β-(aminoethyl)-γ-aminopropyl trimethoxysilane, N-β-(aminoethyl)-γ-aminopropylmethyl dimethoxysilane, γ-aminopropyl triethoxysilane, γ-propyl trimethoxysilane, and γ-mercaptopropyl trimethoxysilane, wherein the alkoxy group and its derivative, e.g., methoxy group ($—OCH_3$), ethoxy group ($—OC_2H_5$) and β-methoxyethoxy group ($—OC_2H_4—O—CH_3$), are hydrophilic group, and the other substituents are hydrophobic group.

The organotitanates having a hydrophilic group and a hydrophobic group include those in which a hydrophilic group such as alkoxy group or its derivative or glycolic acid and a hydrophobic group such as phosphoric acid esters having an alkyl group of 8 or more carbon atoms or water-insoluble higher fatty acids are attached to titanium (Ti). For example, the following compounds are included:

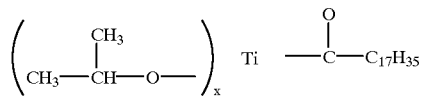

wherein X=1, 2 or 3; for example, Trade name: KR-TTS, Product of Ajinomoto Co.

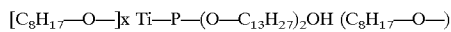

wherein X=1, 2 or 3; for example, Trade name: KR-46B, Product of Ajinomoto Co.

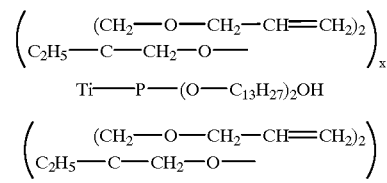

wherein X=1, 2 or 3; for example, Trade name: KR-55, Product of Ajinomoto Co.

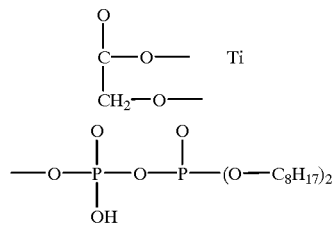

For example, Trade name: KR-138S, Product of Ajinomoto Co. and

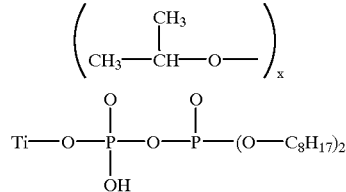

wherein X=1, 2 or 3; for example, Trade name: KR-338X, Product of Ajinomoto Co.

In the above chemical formulae, the left side including titanium as a hydrophilic group is linked to the filler particles, and the right side of titanium as a hydrophobic group has an affinity to the carrier resin.

Incidentally, the group in the parenthesis ( ) in the chemical formulae, which has 8 or higher carbon atoms, acts as a hydrophobic group, which is hydrolyzed with water adsorbed on the surface of filler particle or moisture in air to form a hydrogen bond-forming group and also act as hydrophilic group.

Moreover, the hydrophobic group may be linked directly to titanium or alternatively as a substituent via another group (saturated or unsaturated hydrocarbon group, alkoxy group, etc.) attached to titanium.

In these organotitanates, since titanium forms the titanates as Ti(IV) of the oxidation number 4, a hydrophilic group and a hydrophobic group or other group to which a hydrophobic group is attached are linked to titanium so that the sum of bond number is 4.

As mentioned above, since the thermally conductive compound of the invention has a structure in which the thermally conductive filler particles homogeneously dispersed in the carrier resin are fixed with the solid carrier resin, there is no possibility to separate the filler particles from the carrier resin even though the dispersing agent is bound to water to lose the effect for dispersing the filler particles.

Moreover, the thermally conductive compound of the invention is prepared by mixing the filler particles into a low viscous liquid carrier resin, which has been fused under heating or dissolved in an organic solvent, together with a dispersing agent, so the carrier resin can easily surround the filler particles, which can be filled at a high filling rate, to enhance the thermal conductivity of the thermally conductive compound.

Moreover, the thermally conductive compound of the invention, particularly, the acrylic acid ester in the aforementioned thermally conductive compounds is characterized by at least one of methyl acrylate, ethyl acrylate, n-butyl acrylate, 2-ethylhexyl acrylate, and 2-hydroxyethyl acrylate.

Moreover, the thermally conductive compound of the invention, particularly, the methacrylic acid ester in the aforementioned thermally conductive compounds is characterized by at least one of n-butyl methacrylate, 2-ethylhexyl methacrylate, and hydroxypropyl methacrylate.

According to the invention, the acrylic acid ester and methacrylic acid ester used as plasticizers is at least one of the group consisting of methyl acrylate, ethyl acrylate, n-butyl acrylate, 2-ethylhexyl acrylate, 2-hydroxyethyl acrylate, n-butyl methacrylate, 2-ethylhexyl methacrylate and hydroxypropyl methacrylate. The polymers containing these acrylic acid ester and methacrylic acid ester, which exhibit a glass transition point of lower than 30° C., have a sufficient plasticity to easily satisfy the plasticity of the carrier resin.

The thermally conductive compound of the invention is characterized by having a thermal conductivity of 1 W/m·k or more.

The higher the thermal conductivity of the thermally conductive compound is, the higher the effect is, in view of the purpose of heat conduction. The thermally conductive compound when used as heat transfer means between the element and the cap or body in a semiconductor device is desired to exhibit a thermal conductivity of 1 W/m·k or more.

This is because in recent years, assuming that general conditions for an element having a large calorific value are defined, calorific value: 60 W/cm$^2$; distance between the element and the cap or body (thickness of the thermally conductive compound): 100 $\mu$m; and outside temperature: 20° C., when the temperature of the element is intended to regulate at lower than 80° C. at which the element works normally, the temperature gradient has to be fixed at 20–80=–60 (K/100 $\mu$m)=–6×10$^5$ K/m or higher, and when this is applied to the definition formula Q=–α∇Q (Q is heat flow rate (W/m$^2$), α is thermal conductivity (W/m·K), ∇Q is temperature gradient (K/m)), ∇Q=–(Q/α)≧6×10$^5$ is introduced, and as the calorific value is Q=60 W/cm$^2$=6×10$^5$ W/m$^2$, α≧1 (W/m·K) is obtained from –(6×10$^5$/α)≧6×10$^5$.

According to the thermally conductive compound, since the thermally conductive filler particles comprise at least one of aluminum nitride, boron nitride, aluminum oxide, aluminum, silver, copper, and diamond, of which the thermal conductivity is as high as 30 W/m·K or higher, the thermal conductivity of the thermally conductive compound can be easily fixed at a high value of 1 W/m·K or more.

Moreover, the thermally conductive filler particles of the invention are characterized to have 1 $\mu$m or larger in diameter.

The thermally conductive filler particles according to the invention are preferably used as those of 1 $\mu$m or larger in diameter. When the particle size in diameter is smaller than 1 $\mu$m, the heat is transferred with high frequency through the mutually contacting particle surfaces in the heat conduction route of the thermally conductive compound. The heat conduction on the surface, however, is inferior to that inside of the filler particles, and therefore, it becomes difficult to enhance the thermal conductivity of the thermally conductive compound up to 1 W/m·K or more.

On the other hand, there are no particular limitation as to increase of the thermal conductivity of the thermally conductive compound. In view of the form of the thermally conductive compound in using, wherein the compound interposed between both the parts works to transfer heat from one to the other, when the particle size exceeds the distance between both the parts, namely, the thickness of the thermally conductive compound in using, there is a possibility that the filler particles protrude on the surface of the thermally conductive compound to spoil smoothness of the surface and disturb adhesion of the thermally conductive compound to both the parts.

It is appropriate to use the thermally conductive filler particles of which the particle size is 1 $\mu$m or larger in diameter but it does not exceed the thickness of the thermally conductive compound in using.

Moreover, the invention provides a semiconductor device comprising:

a semiconductor element which is mounted on a portion for mounting a semiconductor element, the portion being formed in an insulator body;

an electrode pad formed on the semiconductor element mounting portion; and an electrode which is on the semiconductor element, the electrode pad and the electrode being electrically connected to each other via a conductive interconnecting member, wherein the thermally conductive compound of claim 1 to 5 is interposed between the semiconductor element mounting portion and the semiconductor element.

The semiconductor device according to the invention comprises a semiconductor element which is mounted on the portion provided for the element on an insulator body, and an electrode pad provided on the element mounting portion for the device which is connected electrically to the electrode provided on the element with a conductive interconnecting member. Since the thermally conductive compound as mentioned above is interposed between the element mounting portion and the semiconductor element, the heat generated by action of the semiconductor element such as a semiconductor integrated circuit element is very effectively transferred to the body, from which the heat is given off outside the device to prevent overheat of the semiconductor element. Thus, a stably working and highly reliable device is provided.

Moreover, since the carrier resin has sufficient plasticity even at a low temperature of around −40 to 50° C., the thermal stress which is generated by the difference of coefficients of thermal expansion between the element and the semiconductor element mounting portion can be absorbed by the plasticity of the carrier resin.

Moreover, the invention provides a semiconductor device comprising:

a semiconductor element;

a container in which a semiconductor element is mounted, the container being composed of an insulator body having a portion for mounting the semiconductor element atop, and a cap;

an electrode of the semiconductor element; and an electrode pad formed on the semiconductor element mounting portion of the insulator body, the electrode being connected via a conductive interconnecting member to the electrode pad, wherein the thermally conductive compound of any one of the above constitutions is interposed between a top face of the semiconductor element and an inner surface of the cap and/or between the bottom surface of the semiconductor element and the semiconductor element mounting portion.

The semiconductor device according to the invention is such a device in which a semiconductor element is disposed in a cell consisting of an insulator body and a cap, of which body the upper part has a portion for mounting a semiconductor element, and in which the electrode of the element is connected electrically to an electrode pad, which is formed on the semiconductor element mounting portion of the insulator body, with a conductive interconnecting member, and the device is characterized in that the thermally conductive compound as mentioned above is interposed between the upper surface of the element and the inner surface of the cap and/or between the bottom surface of the element and the semiconductor element mounting portion. The heat generated by action of the semiconductor element such as a semiconductor integrated circuit element is very effectively transferred to the cap and/or body, from which the heat is given off outside the device to prevent overheat of the semiconductor element. Thus, a stably working and highly reliable semiconductor device is provided.

Moreover, since the carrier resin has sufficient plasticity even at a low temperature of around −40 to 50° C., the thermal stress which is generated by the difference of coefficients of thermal expansion between the element and the semiconductor device mounting portion can be absorbed by the plasticity of the carrier resin.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
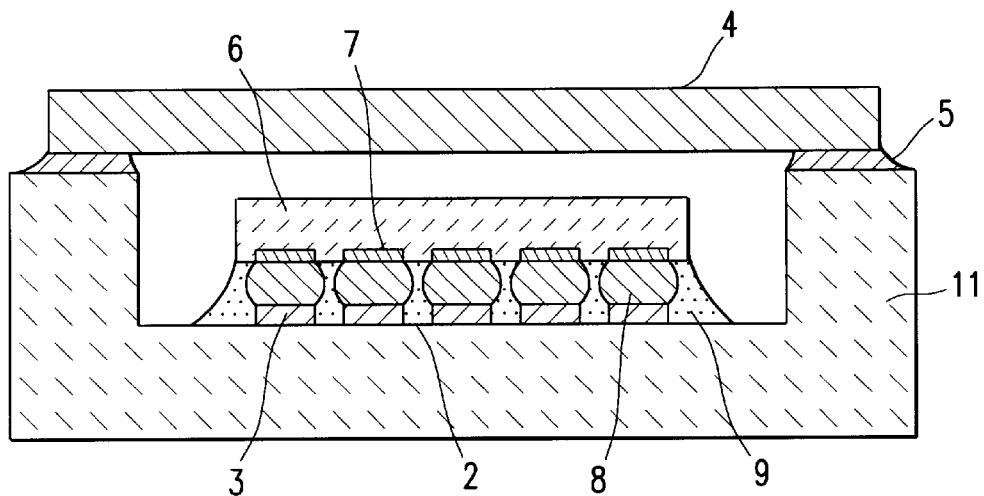
FIG. 1 shows a cross section of an example of the embodiment in the semiconductor device of the invention.

Now referring to the drawings, preferred embodiments of the invention are described below.

FIG. 1 shows a cross section of an example of the embodiment in the semiconductor device of the invention. In the center of a ceramic insulator body 1 mainly made of alumina and so on is provided an element mounting portion 2 for mounting a semiconductor element, onto which a semiconductor element 6 is disposed through a connecting electrode pad 3 and a conductive interconnecting member 8, the pad 3 comprising a high fusing metal such as tungsten, molybdenum, etc., on which a semiconductor element is disposed, and the member 8 comprising tin-lead eutectic solder. In the one main surface of the semiconductor element 6 (the bottom surface in FIG. 1) is provided an electrode 7 for the outside connection, which is come into contact with the conductive interconnecting member 8. The cap 4 consisting of aluminum, etc., is put over the insulator body 1 through a sealing agent 5 consisting of a heat curing resin such as silicone resin, etc., to seal the semiconductor element 6. Between the semiconductor element 6 and the element mounting portion 2 is interposed the thermal compound 9 as the thermally conductive compound of the invention surrounding the conductive interconnecting member 8.

Incidentally, in the semiconductor device of the invention, in place of using the cap 4 and the sealing agent 5, the semiconductor element 6 per se may be covered with a sealing resin, etc., to seal the element 6.

In addition, FIG. 1 shows an example of the flip-chip method for electrically connecting the electrode pad 3 with the electrode 7 by a conductive interconnecting member 8. Alternatively, the electrode pad 3 may be provided around the semiconductor element 6, in order that the electrode 7 is formed on the upper surface of the semiconductor element 6 to connect electrically with a conductive interconnecting member 8 such as bonding wire consisting of gold or aluminum.

Figure 2:
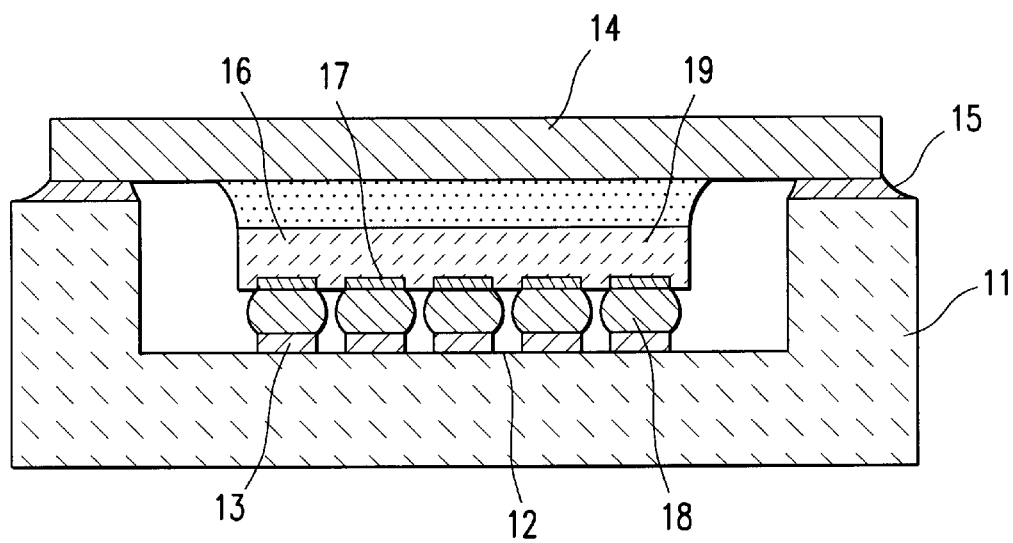
FIG. 2 shows a cross section of another example of the embodiment in the semiconductor device of the invention.

FIG. 2 shows a cross section of an another example of the embodiment in the semiconductor device of the invention. In the center of a ceramic insulator body 11 mainly made of alumina and so on is provided an element mounting portion 12 for mounting a semiconductor element, onto which a semiconductor element 16 is disposed through a connecting electrode pad 13 and a conductive interconnecting member 18, the pad 13 comprising a high fusing metal such as tungsten, molybdenum, etc., on which a semiconductor element is disposed, and the member 18 comprising tin-lead eutectic solder. In the one main surface of the semiconductor element 16 (the bottom surface in FIG. 2) is provided an electrode 17 for the outside connection, which is come into contact with the conductive interconnecting member 18. The cap 14 consisting of aluminum, etc., is put over the insulator body 11 through a sealing agent 15 consisting of a heat curing resin such as silicone resin, etc., to seal the semiconductor element 16. Between the semiconductor element 16 and the cap 14 is placed the thermally conductive compound 19 of the invention.

Incidentally, as for the semiconductor device of the invention, an example in which the thermally conductive compound 19 is interposed between the cap 14 and the semiconductor element 16 is shown. Alternatively, the thermally conductive compound 19 may be interposed between the semiconductor element 16 and the element mounting portion 12, or both between the cap 14 and the element 16 and between the element mounting portion 12 and the element 16.

FIG. 2 shows an example of the so-called flip-chip method, wherein the electrode pad 13 is connected with the electrode 17 electrically through the conductive interconnecting member 18. Similarly in the semiconductor device as shown in FIG. 1, it is also possible that the electrode pad 13 is provided around the semiconductor element 16, on the surface of which the electrode 17 is formed and connected electrically with the conductive interconnecting member 18 such as bonding wire consisting of gold or alminum.

The method for producing the thermally conductive compound of the invention will be explained by the following examples.

[Working Example 1]

First of all, filler particles and a dispersing agent are added into a solvent (a solvent generally used as a conventional aromatic, ester-type or ketone-type organic solvent such as toluene, xylene, ethyl acetate, butyl acetate, acetone, etc.) to give a slurry mixture, which is then evaporated to dryness to yield filler particles (hereinafter referred to as the filler particles ①) of which the surface is coated with a dispersing agent.

Subsequently, a starting resin as a carrier resin is added to the filler particles ①, and the mixture is kneaded with a kneading machine under heating at such a temperature as the starting resin melts (100–200° C.).

At this stage, in order to accelerate the melting of the resin and enhance plasticity of the carrier resin, a plasticizing agent may be added in addition to the plasticizer. Such plasticizing agents include those soluble in the starting resin, for example, phthalic acid esters, e.g., dimethyl phthalate (DMP), diethyl phathalate (DEP), dibutyl phthalate (DBP), dioctyl phthalate (DOP), butyl benzyl phthalate (BBP), ethyl phthalylethyl glycolate (EPEG), methylphthalylethyl glycolate (MPEG), butylphthalylbutyl glycolate (BPBG), etc., phosphoric acid esters, e.g., tricresyl phosphate (TCP), triphenyl phosphate (TPP), tributoxyethyl phosphate (TBXP), etc., fatty acid esters, e.g., diisobutyl adipate (DIBA), dibutyl cebacate (DBS), diisodecyl adipate (DIDA), etc., polyester type, fatty acid type or trimellitate type (tri-2-ethylhexyltrimellitate), etc. These may be added so that the content in the thermally conductive compound is 40 volume % or lower.

The kneaded mixture is then formed into sheets, from which the solvent is evaporated to yield the thermally conductive compound in a form of sheets.

[Working Example 2]

In the same manner as in Working Example 1 as above, filler particles ① are produced.

The filler particles ① are then mixed with a starting resin and a solvent in a mixing machine, e.g., mixer or mill, and the solvent is evaporated in a rotary evaporator, etc., during which operation the viscosity is adjusted to yield paste.

At this stage, in order to accelerate the dissolution of the resin and enhance plasticity of the carrier resin, a plasticizing agent as shown in Working Example 1 may be added at a rate of 40 volume % or lower for the thermally conductive compound.

The resulting paste is then applied on a surface of the cap which is to be faced with the element. Evaporation of the solvent affords the cap to which the thermally conductive compound has preliminarily been applied. Alternatively, the resulting paste is formed into a sheet, from which the solvent is evaporated to yield the thermally conductive compound in a form of sheet.

[Working Example 3]

A mixture of filler particles, a dispersing agent, a starting resin and a solvent is agitated in a mixing machine, to which mixture if required is added the same type of plasticizing agent as shown in Working Example 1, and the viscosity is adjusted in the same manner as in Working Example 2 to yield paste. The resulting paste is then applied on the surface of the cap which is faced with the element. Evaporation of the solvent affords the cap to which the thermally conductive compound has preliminarily been applied. Alternatively, the resulting paste is formed into a sheet, from which the solvent is evaporated to yield the thermally conductive compound in a form of sheet.

EXAMPLE

The following materials were provided: ethylene vinyl acetate copolymer (Product of Mitsui Petrochemical Industries, Ltd.) as a starting resin; diamond (Product of TOMEI DIA; particle size; 3 $\mu$m in diameter), aluminum nitride (Product of Tokuyama Soda; particle size: 1.5 $\mu$m in diameter), boron nitride of hexagonal system (Product of Showa Denko; particle size: 1.5 $\mu$m in diameter), aluminum oxide (Product of Showa Denko; particle size: 1.5 $\mu$m in diameter), and aluminum (Product of Toyo Aluminum; particle size: 10 $\mu$m in diameter) as filler particles; an organotitanate, trade name, Bren Act KR-TTS (Product of Ajinomoto) as a dispersing agent; and ditridecyl phthalate (DTDP) as a plasticizing agent.

These materials were prepared respectively at the rate as shown in Table 1, and mixed with a solvent (toluene) in a mill to yield paste, from which the solvent was evaporated to yield respective samples of the thermally conductive compounds as indicated by the sample numbers 1–22.

As for the respective samples of the thermally conductive compounds as prepared above, the thermal conductivity was measured and a heat cycle test was carried out. The heat cycle test was conducted 500 cycles in a cycle of −40° C.→+125° C.→−40° C., and after the completion of 500 cycles, the external appearance was observed for confirming whether or not the filler particles are separated from the carrier resin as well as the plasticizing agent from the resin by visual observation. As for thermal conductivity, a sample having a value of 1.0 W/m·K or more was judged good.

The rates and the results of evaluation were summarized in Table 1. The asterisk * attached to the sample number in Table 1 indicates that the sample is beyond the scope of the invention.

TABLE 1

| | | | | | | | Dispersant | | | Presence of separation from | |
| | | | Rate of Composition of Thermal Compound | | | | | | | | |
| | Carrier | Filler Particles (volume %) | | | | | (additional | Plasticizing | Thermal | Carrier Resin | |
| Sample no. | Resin (volume %) | Aluminum nitride | Diamond | Boron nitride | Aluminum oxide | Aluminum | additive; weight %) | Agent (volume %) | conductivity (W/m · K) | Filler Particles | Plasticizing Agent |
|---|---|---|---|---|---|---|---|---|---|---|---|
| *1 | 35 | 20 | — | — | — | — | 1 | 35 | 0.8 | none | none |
| *2 | 60 | 40 | — | — | — | — | 0 | 0 | 0.9 | none | none |
| 3 | 60 | 40 | — | — | — | — | 0.5 | 0 | 1.0 | none | none |
| 4 | 40 | 40 | — | — | — | — | 1 | 20 | 1.1 | none | none |
| 5 | 20 | 40 | — | — | — | — | 1 | 40 | 1.1 | none | none |
| 6 | 10 | 40 | — | — | — | — | 1 | 50 | 1.0 | none | weakly positive |
| 7 | 20 | 60 | — | — | — | — | 1 | 20 | 3.3 | none | none |
| 8 | 20 | 60 | — | — | — | — | 3 | 20 | 3.2 | none | none |
| 9 | 20 | 60 | — | — | — | — | 5 | 20 | 3.1 | none | none |
| 10 | 20 | 60 | — | — | — | — | 5 | 20 | 2.9 | none | none |
| 11 | 30 | 50 | — | — | — | — | 1 | 20 | 1.8 | none | none |
| 12 | 18 | 70 | — | — | — | — | 1 | 12 | 5.2 | none | none |
| 13 | 12 | 80 | — | — | — | — | 1 | 8 | 3.7 | none | weakly positive |
| 14 | 9 | 85 | — | — | — | — | 1 | 6 | 1.5 | none | weakly positive |
| *15 | 5 | 90 | — | — | — | — | 1 | 5 | 0.9 | none | positive |
| 16 | 15 | — | 70 | — | — | — | 1 | 15 | 7.3 | none | none |
| 17 | 15 | — | — | 70 | — | — | 1 | 15 | 3.4 | none | none |
| 18 | 15 | — | — | — | 70 | — | 1 | 15 | 3.1 | none | none |
| 19 | 15 | — | — | — | — | 70 | 1 | 15 | 5.5 | none | none |
| 20 | 15 | — | 7 | — | — | 63 | 1 | 15 | 5.8 | none | none |
| 21 | 15 | — | — | 7 | — | 63 | 1 | 15 | 6.2 | none | none |
| 22 | 15 | — | — | — | 7 | 63 | 1 | 15 | 5.7 | none | none |

The asterisk * indicates that the sample is beyond the scope of the invention.

In the sample nos. 1–15, the mixing ratio of the carrier resin to the filler particles to the dispersing agent was respectively varied. Among these samples, the sample nos. 1, 2 and 15 to which * is attached were beyond the scope of the invention. In the sample no. 1 in which the filler particles were insufficient and in the sample no. 2 to which no dispersing agent was added, the thermal conductivity is low in both cases. On the other hand, in the sample no. 15 in which the carrier resin is insufficient, there was observed separation of the plasticizing agent from the resin probably due to exceeding the limitation of co-solubility.

Incidentally, the reason that in the sample no. 15 the thermal conductivity is low though the filler particles are as much as 90 volume % is due to occurrence of void (space) among the particles.

On the contrary, the sample nos. 3–5 and 7–12 involving the thermally conductive compound of the invention exhibit high thermal conductivity and cause no phase separation to afford good results in any cases. Furthermore, the reliability of the semiconductor device that was made according to the structures as shown in FIG. 1 and FIG. 2 using the samples of the thermally conductive compound was evaluated by repeated temperature changes in a heat cycle test. As a result, there was no unusual change in appearance and the characteristics in any device in which the thermally conductive compound of the invention was used.

Incidentally, though a good result was obtained in the sample nos. 6, 13 and 14, there was a tendency to cause readily the phase separation between the carrier resin and the plasticizing agent. Moreover, the reliability of the semiconductor device that was made according to the structures as shown in FIG. 1 and FIG. 2 using these samples of the thermally conductive compound was evaluated by repeated temperature changes in a heat cycle test. As a result, there was observed loss of the filler particles in some cases probably due to insufficiency of the carrier resin and incidentally there was a tendency to readily produce cracks in the thermally conductive compound and cause peeling-off from the element or cap.

Sample nos. 16–22 were respectively provided for the comparative tests as to the kind of the filler particles. In these samples, any of which contained the thermally conductive compound of the invention, they exhibit high thermal conductivity and there was no phase separation in any cases.

There was, however, observed a difference in the thermal conductivity due to the quality and size of the filler particles. For example, when sample no. 19 was compared with sample nos. 20–22, the latter in which a mixture of filler particles being different in quality and size was used exhibited higher thermal conductivity than that of sample no. 19 in which aluminum of 10 μm in diameter was used alone as filler particles.

The reliability of the semiconductor device that was made according to the structures as shown in FIG. 1 and FIG. 2 using the samples of the thermally conductive compound was evaluated by repeated temperature changes in a heat cycle test. As a result, there was no unusual change in appearance and the characteristics in any device in which the thermally conductive compound of the invention was used.

Incidentally, the present invention is not limited to the aforementioned embodiment and is variable within the scope of the invention as far as the variation does not deviate from the gist of the invention. For example, the thermal conductivity may be ensured with the thermally conductive compound interposed between a heat sink and a cap. Furthermore, in order to give a radiation effect to the connecting substrate in a semiconductor device, the thermally conductive compound may be inserted into the portion which has no relation with electrical connection.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A thermally conductive compound comprising:
    15 to 60 volume % of a thermoplastic carrier resin comprising, a copolymer of ethylene and at least one monomer selected from the group consisting of vinyl acetate, acrylic acid esters and methacrylic acid esters, or a blend a polyethylene and said copolymer;
    40 to 85 volume % of at least one thermally conductive filler particles selected from the group consisting of aluminum nitride, boron nitride, aluminum oxide, aluminum, silver, copper and diamond, the thermally conductive filler particles dispersed in the carrier resin; and
    at least one dispersing agent selected from the group consisting of glycerin fatty acid esters, polymers of glycerin fatty acid esters, organic silanes having both hydrophilic groups and hydrophobic groups, and organic titanates having both hydrophilic groups and hydrophobic groups, at a rate of 0.5 to 5 weight % based on the filler particles, wherein the thermally conductive compound has a thermal conductivity of at least 1 W/m·K and wherein the thermally conductive compound maintains sufficient plasticity between −40 and 50° C. to neutralize thermal stress caused by components that are held in contact with the thermally conductive compound having different coefficients of thermal expansion.

2. The thermally conductive compound of claim 1, wherein the acrylic acid ester is at least one of methyl acrylate, ethyl acrylate, n-butyl acrylate, 2-ethylhexyl acrylate, and 2-hydroxyethyl acrylate.

3. The thermally conductive compound of claim 1, wherein the methacrylic acid ester is at least one of n-butyl methacrylate, 2-ethylhexyl methacrylate, and hydroxypropyl methacrylate.

4. The thermally conductive compound of claim 1, wherein the particle size of the filler particles is 1 μm or larger in diameter.

* * * * *